(12) United States Patent
Lu et al.

(10) Patent No.: US 8,012,317 B2
(45) Date of Patent: *Sep. 6, 2011

(54) FRONT ELECTRODE INCLUDING TRANSPARENT CONDUCTIVE COATING ON PATTERNED GLASS SUBSTRATE FOR USE IN PHOTOVOLTAIC DEVICE AND METHOD OF MAKING SAME

(75) Inventors: Yiwei Lu, Ann Arbor, MI (US); Willem den Boer, Brighton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 701 days.

This patent is subject to a terminal disclaimer.

(21) Appl. No.: 11/790,687

(22) Filed: Apr. 26, 2007

(65) Prior Publication Data

US 2008/0107799 A1 May 8, 2008

Related U.S. Application Data

(63) Continuation-in-part of application No. 11/591,668, filed on Nov. 2, 2006.

(51) Int. Cl.
*C23C 14/34* (2006.01)
(52) U.S. Cl. .............. 204/192.26; 204/192.29; 136/243; 136/252; 136/259
(58) Field of Classification Search ............. 204/192.26, 204/192.27, 192.28, 192.29; 136/243, 252, 136/259
See application file for complete search history.

(56) References Cited

U.S. PATENT DOCUMENTS

| | | | |
|---|---|---|---|
| 3,411,934 A | 11/1968 | Englehart et al. | |
| 4,155,781 A | 5/1979 | Diepers | |
| 4,162,505 A | 7/1979 | Hanak | |
| 4,163,677 A | 8/1979 | Carlson et al. | |
| 4,213,798 A | 7/1980 | Williams et al. | |
| 4,378,460 A | 3/1983 | Williams | |
| 4,497,974 A * | 2/1985 | Deckman et al. ............ | 136/259 |
| 4,532,373 A | 7/1985 | Matsuura et al. | |
| 4,554,727 A | 11/1985 | Deckman et al. | |
| 4,598,306 A | 7/1986 | Nath et al. | |
| 4,663,495 A | 5/1987 | Berman et al. | |

(Continued)

FOREIGN PATENT DOCUMENTS

DE 197 13 215 10/1998

(Continued)

OTHER PUBLICATIONS

"Improved Fill Factors in Amorphous Silicon Solar Cells on Zinc Oxide by Insertion of a Germanium Layer to Block Impurity Incorporation", Ganguly et al., Applied Physics Letters, vol. 85, No. 3, Jul. 19, 2004, pp. 479-481.

(Continued)

Primary Examiner — Rodney G McDonald
(74) Attorney, Agent, or Firm — Nixon & Vanderhye P.C.

(57) ABSTRACT

This invention relates to a photovoltaic device including an electrode such as a front electrode/contact. In certain example embodiments, the front electrode of the photovoltaic device includes a multi-layered transparent conductive coating which is sputter-deposited on a textured surface of a patterned glass substrate. In certain example embodiments, a maximum transmission area of the substantially transparent conductive front electrode is located under a peak area of a quantum efficiency (QE) curve of the photovoltaic device and a light source spectrum used to power the photovoltaic device.

13 Claims, 5 Drawing Sheets

U.S. PATENT DOCUMENTS

| | | | |
|---|---|---|---|
| 4,689,438 | A | 8/1987 | Fukatsu et al. |
| 4,940,495 | A | 7/1990 | Weber et al. |
| 5,073,451 | A | 12/1991 | Iida et al. |
| 5,091,764 | A | 2/1992 | Asaoka et al. |
| 5,110,637 | A | 5/1992 | Ando et al. |
| 5,131,954 | A | 7/1992 | Vogeli et al. |
| 5,171,411 | A | 12/1992 | Hillendahl et al. |
| 5,256,858 | A | 10/1993 | Tomb |
| 5,326,519 | A | 7/1994 | Claussen |
| 5,589,403 | A | 12/1996 | Toyama et al. |
| 5,603,778 | A | 2/1997 | Sonoda |
| 5,650,019 | A | 7/1997 | Yamada et al. |
| 5,667,853 | A | 9/1997 | Fukuyoshi et al. |
| 5,699,035 | A | 12/1997 | Ito et al. |
| 5,861,189 | A | 1/1999 | Sheel et al. |
| 5,891,556 | A | 4/1999 | Anderson et al. |
| 5,964,962 | A | 10/1999 | Sannomiya et al. |
| 6,048,621 | A | 4/2000 | Gallego et al. |
| 6,123,824 | A | 9/2000 | Sano et al. |
| 6,187,824 | B1 | 2/2001 | Swank |
| 6,288,325 | B1 | 9/2001 | Jansen et al. |
| 6,344,608 | B2 | 2/2002 | Kariya et al. |
| 6,365,823 | B1 | 4/2002 | Kondo |
| 6,406,639 | B2 | 6/2002 | Sakaguchi et al. |
| 6,433,913 | B1 | 8/2002 | Bauer et al. |
| 6,469,438 | B2 | 10/2002 | Fukuoka et al. |
| 6,506,622 | B1 | 1/2003 | Shiozaki |
| 6,613,603 | B1 | 9/2003 | Sano |
| 6,627,322 | B2 | 9/2003 | Choi et al. |
| 6,686,050 | B2 | 2/2004 | Lingle et al. |
| 6,746,775 | B1 | 6/2004 | Boire et al. |
| 6,747,779 | B1 | 6/2004 | Morin et al. |
| 6,784,361 | B2 | 8/2004 | Carlson et al. |
| 6,825,409 | B2 | 11/2004 | Haussler et al. |
| 6,827,970 | B2 | 12/2004 | Varanasi et al. |
| 6,844,210 | B2 | 1/2005 | Fukuoka et al. |
| 6,852,555 | B1 | 2/2005 | Roman et al. |
| 6,933,672 | B2 | 8/2005 | Hosokawa |
| 6,936,347 | B2 | 8/2005 | Laird et al. |
| 6,963,168 | B2 | 11/2005 | Eida et al. |
| 6,963,383 | B2 | 11/2005 | Tokailin et al. |
| 6,972,750 | B2 | 12/2005 | Yu |
| 6,975,067 | B2 | 12/2005 | McCormick et al. |
| 6,979,414 | B2 | 12/2005 | Hosokawa |
| 6,987,547 | B2 | 1/2006 | Yang et al. |
| 6,989,280 | B2 | 1/2006 | Ko |
| 7,012,728 | B2 | 3/2006 | Morin et al. |
| 7,037,869 | B2 | 5/2006 | Landa et al. |
| 7,087,834 | B2 | 8/2006 | McFarland |
| 7,090,921 | B2 | 8/2006 | Stachowiak |
| 7,132,666 | B2 | 11/2006 | Nakata et al. |
| 7,141,863 | B1 | 11/2006 | Compaan et al. |
| 7,144,837 | B2 | 12/2006 | Landa et al. |
| 7,153,579 | B2 | 12/2006 | Kriltz et al. |
| 7,169,722 | B2 | 1/2007 | Landa et al. |
| 7,317,237 | B2 | 1/2008 | Niira et al. |
| 2003/0011047 | A1 | 1/2003 | Cunningham et al. |
| 2003/0064255 | A1 | 4/2003 | Dannenberg |
| 2003/0165693 | A1 | 9/2003 | Hartig et al. |
| 2003/0218153 | A1 | 11/2003 | Abe |
| 2004/0038051 | A1 | 2/2004 | Fujisawa et al. |
| 2004/0086723 | A1 | 5/2004 | Thomsen et al. |
| 2004/0113146 | A1 | 6/2004 | Dahmani |
| 2004/0187914 | A1 | 9/2004 | Matsuda et al. |
| 2004/0244829 | A1 | 12/2004 | Rearick et al. |
| 2005/0016583 | A1 | 1/2005 | Blieske et al. |
| 2005/0042460 | A1 | 2/2005 | Kriltz |
| 2005/0257824 | A1 | 11/2005 | Maltby et al. |
| 2005/0258029 | A1 | 11/2005 | Muller et al. |
| 2006/0065299 | A1 | 3/2006 | Fukawa et al. |
| 2006/0099441 | A1 | 5/2006 | Teyssedre |
| 2006/0169316 | A1 | 8/2006 | Thomsen et al. |
| 2006/0219988 | A1 | 10/2006 | Abe |
| 2006/0228564 | A1 | 10/2006 | Demiryont |
| 2006/0248923 | A1 | 11/2006 | Krasnov et al. |
| 2006/0249199 | A1 | 11/2006 | Thomsen et al. |
| 2006/0289055 | A1 | 12/2006 | Sridharan et al. |
| 2007/0029187 | A1 | 2/2007 | Krasnov |
| 2007/0120045 | A1 | 5/2007 | Yokoyama |
| 2007/0184573 | A1 | 8/2007 | Krasnov |
| 2007/0193624 | A1 | 8/2007 | Krasnov |
| 2007/0209698 | A1 | 9/2007 | Thomsen et al. |
| 2007/0215205 | A1 | 9/2007 | Thomsen et al. |
| 2008/0047602 | A1 | 2/2008 | Krasnov |
| 2008/0047603 | A1 | 2/2008 | Krasnov |
| 2008/0105293 | A1 | 5/2008 | Lu et al. |
| 2008/0105298 | A1 | 5/2008 | Lu et al. |
| 2008/0105299 | A1 | 5/2008 | Krasnov |
| 2008/0105302 | A1 | 5/2008 | Lu et al. |
| 2008/0163929 | A1 | 7/2008 | Krasnov |
| 2008/0169021 | A1 | 7/2008 | Krasnov |
| 2008/0178932 | A1 | 7/2008 | den Boer et al. |
| 2008/0210303 | A1 | 9/2008 | Lu et al. |
| 2008/0223430 | A1 | 9/2008 | Krasnov et al. |
| 2008/0223436 | A1 | 9/2008 | den Boer et al. |
| 2008/0302414 | A1 | 12/2008 | den Boer et al. |
| 2008/0308145 | A1 | 12/2008 | Krasnov et al. |
| 2008/0308146 | A1 | 12/2008 | Krasnov et al. |
| 2008/0308151 | A1 | 12/2008 | den Boer et al. |
| 2009/0084438 | A1 | 4/2009 | den Boer et al. |
| 2009/0126791 | A1 | 5/2009 | Lu et al. |
| 2009/0194155 | A1 | 8/2009 | den Boer et al. |
| 2009/0194157 | A1 | 8/2009 | den Boer et al. |

FOREIGN PATENT DOCUMENTS

| | | |
|---|---|---|
| DE | 199 58 878 | 6/2001 |
| EP | 0 180 222 | 5/1986 |
| EP | 0 204 562 | 10/1986 |
| EP | 0 204 562 | 12/1986 |
| EP | 0 252 489 | 1/1988 |
| EP | 0 372 929 | 6/1990 |
| EP | 0 403 936 | 12/1990 |
| EP | 0 436 741 | 7/1991 |
| EP | 0 987 774 | 3/2000 |
| EP | 0 991 129 | 5/2000 |
| EP | 1 063 317 | 12/2000 |
| EP | 1 115 160 | 7/2001 |
| EP | 1 174 397 | 1/2002 |
| EP | 1 300 889 | 4/2003 |
| EP | 1 343 176 | 9/2003 |
| FR | 2 551 267 | 3/1985 |
| GB | 2188924 | 10/1987 |
| JP | 61-141185 | 6/1986 |
| JP | 61 278171 | 12/1986 |
| JP | 62-179165 | 6/1987 |
| JP | 02-106978 | 4/1990 |
| JP | 2164077 | 6/1990 |
| JP | 7122764 | 5/1995 |
| JP | 11-298030 | 10/1999 |
| WO | WO 94/25397 | 11/1994 |
| WO | WO 03/019598 | 3/2003 |
| WO | WO 2006/029073 | 3/2006 |
| WO | WO 2008/036769 | 3/2008 |
| WO | WO 2008/063305 | 5/2008 |
| WO | WO 2008/154128 | 12/2008 |

OTHER PUBLICATIONS

"Improved Transparent Conductive Oxide/p+/i Junction in Amorphous Silicon Solar Cells by Tailored Hydrogen Flux During Growth", Nuruddin et al., Thin Solid Films 394 (2001) pp. 49-63.

"Work Function Determination of Zinc Oxide Films", Sundaram et al., J. Vac. Sci. Technol. A. 15(2), Mar./Apr. 1997, pp. 428-430.

"Optoelectronic Properties of Thin Amorphous and Micro-Crystalline P-Type Films Developed for Amorphous Silicon-Based Solar Cells", Winz et al., Materials Research Society Symposium Proceedings vol. 420, Apr. 1996.

"Investigation of Indium Tin Oxide/Zinc Oxide Multilayer Ohmic Contacts to n-Type GaN Isotype Conjunction", Lee et al., Applied Physics Letters, vol. 78, No. 22, May 28, 2001, pp. 3412-3414.

"The Insert of Zinc Oxide Thin Film in Indium Tin Oxide Anode for Organic Electroluminescence Devices", Jeong et al., Current Applied Physics4 (2004) 655-658.

Improvement in Quantum Efficiency of Thin Film Si Solar Cells Due to the Suppression of Optical Reflectance at Transparent Conducting Oxide/Si Interface by $TiO_2$/ZnO Antireflection Coating, Fujibayashi et al., Applied Physics Letters 88, (2006) (2pgs).
"Thin-Film Compound Semiconductor Photovoltaics", Shafarman et al., Materials Research Society, vol. 865, Mar. 29-Apr. 1, 2005.
U.S. Appl. No. 11/591,668, filed Nov. 2, 2006.
"Numerical Modelling of Rear Junction SI Solar Cells Using Fermi-Dirac Statistics", FEIT-Engineering, Australian National University, Harder et al., (4pgs).
Partial International Search Report dated Jul. 15, 2008.
Japan Display' 89, Soda Lime Glass as a Substrate for TFT-LCDs, Uchikoga et al., pp. 426-429, International Display Research Conference.
"Al-Doped Zinc Oxide Films Deposited by Simultaneous fr and dc Excitation of a Magnetron Plasma: Relationships Between Plasma Parameters and Structural and Electrical Film Properties", Cebulla et al., J.Appl. Phys. 83 (2), Jan. 15, 1998.
"Large-Area Deposition for Crystalline Silicon on Glass Modules", Basore, 3rd World Conference on Photovoltaic Energy Conversion, May 2003, (pp. 1-4).
"Physical Properties of Natively Textured Yttrium Doped Zinc Oxide Films by Sol-Gel", Kaur et al., Journal of Materials Science: Materials in Electronics 16 (2005) pp. 649-655.
"Highly Transparent and Conductive Rare Earth Doped ZnO Thin Films Prepared by Magnetron Sputtering", Minami et al., Kanazawa Institute of Technology, Thin Solid Films, vol. 366, pp. 63-68, 2000.
"The Band Structure and Work Function of Transparent Conducting Aluminum and Maganese Co-Doped Zinc Oxide Films", Cao et al., ACTA Metallurgica Sinica (English Letters), vol. 18, No. 3, pp. 356-362, 2005.
"Novel Device Structure for Cu(In, Ga)Se2 Thin film Solar Cells Using Transparent Conducting Oxide Back and Front Contacts", Nakada et al., Solar Energy 77 (2004) 739-747.
"TCO and Light Trapping in Silicon Thin Film Solar Cells". Muller et al., Solar Energy 77 (2004) pp. 917-930.
"CdTe/CdS solar cells on flexible substrates", Mathew, Xavier et al., Solar Energy 77 (2004) 831-838.
"Improved Three-Dimensional Optical Model for Thin-Film Silicon Solar Cells", Springer et al., Journal of Applied Physics, vol. 96, No. 9, Nov. 1, 2004.
U.S. Appl. No. 11/600,912, filed Nov. 17, 2006.
"A Transparent Metal: Nb-Doped Anatase TiO2", Furubayashi et al., Applied Physics Letters 86, (2005).
New Transparent Conductors Anatase Ti1-xMxO2 (M=Nb, Ta): Transport and Optical Properties, Furubayashi et al., Materials Research Society, vol. 905E, 2006.
"Transparent Conductors and Barrier Layers for Thin Film Solar Cells", Gordon et al., Final Technical Report Jun. 15, 2001.
"TiO2-Coated TCO (SnO2:F) Films Prepared by AP-CVD with High Durability against Hydrogen Radicals". Kambe et al., 15th International Photovoltaic Science & Engineering Conference (PVSEC 15) China 2005.
"Self-Aligning, Industrially Feasible Back Contacted Silicon Solar Cells with Efficiencies >18%", Muller et al., 3rd World Conference on Photovoltaic Energy Conversion, May 11-18, 2003, Osaka, Japan.
"Role of the Glass/TCO Substrate in Thin film Silicon Solar Cells", Muller et al., WCPEC-3, Psaka, Japan, May 11-18, 2003.
"Enhancement of Light Trapping in Silicon Thin-Film Solar Cells by Optimizing From TCO and Back Reflector", Jeon et al. 15th Int. Photovoltaic Science & Engineering Conference, China, 2005.
"Recent Applications of Pulsed Lasers in Advanced Materials Processing", Booth, Thin Solid Films 453-454 (2004) pp. 450-457.
U.S. Appl. No. 11/509,094, filed Aug. 24, 2006.
"TiN and TiO2:Nb Thin Film Preparation Using Hollow Cathode Sputtering with Application to Solar Cells", Guo et al., J. Vac. Sci. Technol. A 24(4) (Jul./Aug. 2006) pp. 1529 Title Author journal volume page.
"Physical and Photoelectrochemical Properties of the TiO2-ZnO System", Yoon et al., Materials Research Bulletin, vol. 34, No. 9 (1999) pp. 1451-1461.
"Transparent Conducting Oxides (TCO's) for Amorphous Silicon Solar Cells", Hegedus et al., AIP Conf. Proc. vol. 353, No. 1 (1996) pp. 465-472.
"TiO2 Thin Films as Protective Material for Transparent-Conducting Oxides Used in Si Thin Film Solar Cells", Natsuhara et al., Solar Energy Materials & Solar Cells 90 (2006) pp. 2867-2880.
"Texture Etched ZnO:Al Coated Glass Substrates for Silicon Based Thin Film Solar Cells", Kluth et al., Thin Solid Films 351 (1999) pp. 247-253.
U.S. Appl. No. 11/507,660, filed Aug. 22, 2006.
U.S. Appl. No. 11/591,676, filed Nov. 2, 2006.
U.S. Appl. No. 11/650,564, filed Jan. 8, 2007.
U.S. Appl. No. 11/653,431, filed Jan. 16, 2007.
U.S. Appl. No. 11/717,787, filed Mar. 14, 2007.
U.S. Appl. No. 11/790,812, filed Apr. 27, 2007.
U.S. Appl. No. 11/812,078, filed Jun. 14, 2007.
U.S. Appl. No. 11/808,765, filed Jun. 12, 2007.
U.S. Appl. No. 11/898,641, filed Sep. 13, 2007.
U.S. Appl. No. 11/984,092, filed Nov. 13, 2007.
U.S. Appl. No. 11/987,664, filed Dec. 3, 2007.
U.S. Appl. No. 11/984,662, filed Nov. 20, 2007.
U.S. Appl. No. 12/068,117, filed Feb. 1, 2008.
U.S. Appl. No. 12/068,119, filed Feb. 1, 2008.
U.S. Appl. No. 12/149,263, filed Apr. 29, 2008.
U.S. Appl. No. 12/232,619, filed Sep. 19, 2008.
U.S. Appl. No. 12/285,374, filed Oct. 2, 2008.
U.S. Appl. No. 12/285,890, filed Oct. 15, 2008.

* cited by examiner

FRONT ELECTRODE INCLUDING TRANSPARENT CONDUCTIVE COATING ON PATTERNED GLASS SUBSTRATE FOR USE IN PHOTOVOLTAIC DEVICE AND METHOD OF MAKING SAME

This application is a continuation-in-part (CIP) of U.S. Ser. No. 11/591,668, filed Nov. 2, 2006, the entire disclosure of which is hereby incorporated herein by reference.

This invention relates to a photovoltaic device including an electrode such as a front electrode/contact. In certain example embodiments, the front electrode of the photovoltaic device includes a conformal transparent conductive coating (single or multi-layered) which is sputter-deposited on a textured surface of a patterned glass substrate. In certain example instances, this is advantageous in that efficiency of the photovoltaic device can be improved by increasing light absorption by the active semiconductor via both increasing light intensity passing through the front glass substrate and front electrode, and increasing the light path in the semiconductor photovoltaic conversion layer.

BACKGROUND AND SUMMARY OF EXAMPLE EMBODIMENTS OF INVENTION

Photovoltaic devices are known in the art (e.g., see U.S. Pat. Nos. 6,784,361, 6,288,325, 6,613,603, and 6,123,824, the disclosures of which are hereby incorporated herein by reference). Amorphous silicon photovoltaic devices, for example, include a front electrode or contact. Typically, the transparent front electrode is made of a pyrolytic transparent conductive oxide (TCO) such as zinc oxide or tin oxide formed on a substrate such as a glass substrate. In many instances, the transparent front electrode is formed of a single layer using a method of chemical pyrolysis where precursors are sprayed onto the glass substrate at approximately 400 to 600 degrees C. Typical pyrolytic fluorine-doped tin oxide TCOs as front electrodes may be about 400 nm thick, which provides for a sheet resistance ($R_s$) of about 15 ohms/square.

It is known to increase the light path in thin film photovoltaic devices by etching/patterning a surface of a TCO front electrode after it has been deposited on the front glass substrate. It is also known to deposit a TCO on a flat glass substrate in a high process pressure environment in order to cause texturing of the TCO front electrode via column structure growth in the TCO. Unfortunately, both of these techniques degrade the electrical properties of the TCO front electrode of the photovoltaic device. Thus, conventionally a 300 or 400 nm thickness or more is typically needed to achieve a sheet resistance of less than 15 ohms/square for thin film solar cell applications.

It is also known to increase light input via reduced reflection, by minimizing reflection between the TCO front electrode and adjacent materials. However, this approach only increases light input and does not significantly increase light path because of difficulties in implementing the same with post-etching or column structure growth.

In view of the above, it will be appreciated that there exists a need in the art for an improved front electrode structure, and/or method of making the same, for use in a photovoltaic device or the like.

Certain example embodiments of this invention relate to a front electrode for use in a photovoltaic device or the like. In certain example embodiments of this invention, a transparent conductive coating is sputter-deposited on a textured (e.g., etched and/or patterned) surface of a glass substrate in order to form a front electrode structure. The use of sputter-deposition to form the conductive electrode is advantageous in that it permits the electrode (single or multi-layered) to be deposited in a conformal manner so that both major surfaces of the electrode are shaped in a manner similar to that of the textured surface of the glass substrate on which the electrode has been deposited. Thus, the surface of the front electrode closest to the semiconductor absorber film of the photovoltaic device is also textured.

In certain example embodiments, this is advantageous in that efficiency of the photovoltaic device can be improved by increasing light absorption by the active semiconductor film via both (a) increasing light intensity passing through the front glass substrate and front electrode due to the textured surface(s) of both the front electrode and front glass substrate, and (b) increasing the light path in the semiconductor photovoltaic conversion layer, while at the same time maintaining good electrical properties of the front electrode.

The front electrode may be a single-layer of a transparent conductive oxide (TCO) in certain example embodiments of this invention. In other example embodiments, the front electrode may be made up of multiple layers; one or more of which may be conductive. Because sputtered thin films may be conformal to the patterned glass substrate, multiple layered thin films with controlled thickness and optical properties may be fabricated one layer after another to enhance the transmission of light into the semiconductor absorber film through optical interference, and the increased light path through the scattering inherited from the patterned glass may be preserved in certain example embodiments.

In certain example embodiments of this invention, the front electrode of a photovoltaic device is comprised of a multi-layer coating including at least one transparent conductive oxide (TCO) layer (e.g., of or including a material such as tin oxide, zinc oxide, or the like) and at least one conductive substantially metallic IR reflecting layer (e.g., based on silver, gold, or the like). In certain example instances, the multilayer front electrode coating may include a plurality of TCO layers and/or a plurality of conductive substantially metallic IR reflecting layers arranged in an alternating manner in order to provide for reduced visible light reflections, increased conductivity, increased IR reflection capability, and so forth.

In certain example embodiments of this invention, there is provided a method of making a photovoltaic device, the method comprising: providing a glass substrate; etching and/or patterning at least one major surface of the glass substrate so as to form a textured surface of the glass substrate; sputter-depositing a substantially conformal front electrode on the textured surface of the glass substrate, the front electrode being substantially conformal so that both major surfaces of the front electrode are textured in a manner similar to the textured surface of the glass substrate; and using the substantially conformal front electrode formed on the textured surface of the glass substrate at a light incident side of a photovoltaic device.

In other example embodiments of this invention, there is provided a method of making a photovoltaic device, the method comprising: forming a substantially transparent conductive front electrode on a glass substrate; determining a quantum efficiency (QE) curve for a photovoltaic device, and forming the substantially transparent front electrode in a manner so that a maximum transmission area of the substantially transparent front electrode is located under a peak area of the QE curve for the photovoltaic device; and using the substantially transparent front electrode formed on the glass substrate at a light incident side of a photovoltaic device.

In still further example embodiments of this invention, there is provided a photovoltaic device comprising: a front glass substrate; a semiconductor film; a substantially transparent conductive front electrode provided between at least the front glass substrate and the semiconductor film; and wherein a maximum transmission area of the substantially transparent conductive front electrode is located under a peak area of a quantum efficiency (QE) curve of the photovoltaic device.

DETAILED DESCRIPTION OF EXAMPLE EMBODIMENTS OF THE INVENTION

Figure 1:
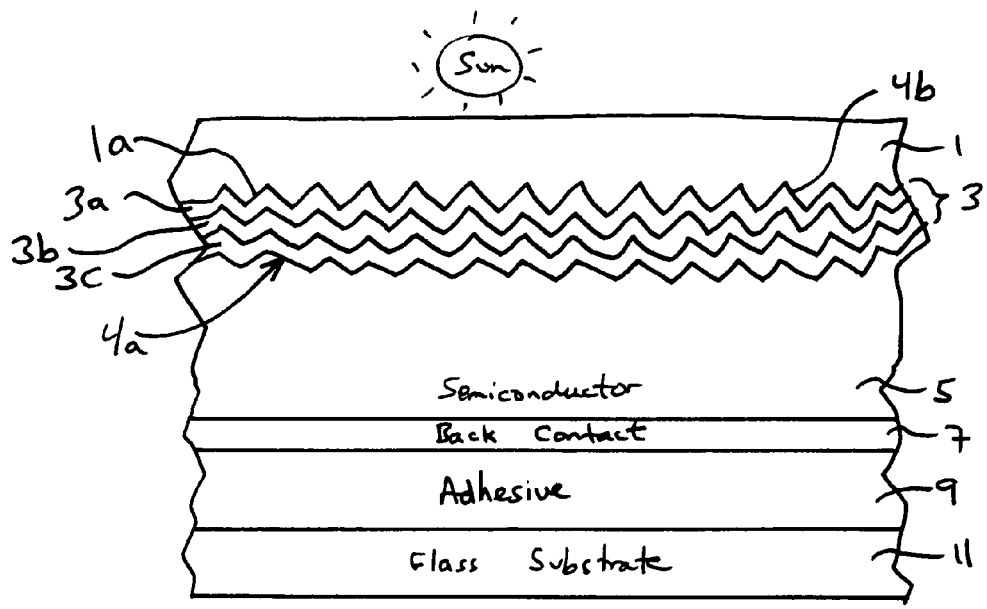
FIG. 1 is a cross sectional view of an example photovoltaic device according to an example embodiment of this invention.

Referring now more particularly to the figures in which like reference numerals refer to like parts/layers in the several views.

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe photovoltaic devices, polysilicon and/or microcrystalline Si photovoltaic devices, and the like.

Certain example embodiments of this invention relate to a front electrode 3 for use in a photovoltaic device or the like, and a method of making the same. In certain example embodiments of this invention, a transparent conductive coating 3 is sputter-deposited on a textured (e.g., etched and/or patterned) surface of a glass substrate 1 in order to form a front electrode structure. Herein, the user of the word "patterned" covers etched surfaces, and the use of the word "etched" covers patterned surfaces. The use of sputter-deposition to form the conductive electrode 3 is advantageous in that it permits the electrode (single or multi-layered) 3 to be deposited in a conformal manner so that both major surfaces of the electrode are shaped in a manner similar to that of the textured surface 1a of the glass substrate 1 on which the electrode 3 has been deposited. The textured surface 1a of the glass substrate 1 may have a prismatic surface, a matte finish surface, or the like in different example embodiments of this invention. Thus, the surface 4a of the front electrode 3 closest to the semiconductor absorber film 5 of the photovoltaic device is also textured. The textured surface 1a of the glass substrate 1, and both major surfaces 4a, 4b of the electrode 3, may have peaks and valleys defined therein with inclined portions interconnecting the peaks and valleys (e.g., see FIG. 1).

In certain example embodiments, this is advantageous in that efficiency of the photovoltaic device can be improved by increasing light absorption by the active semiconductor film 5 via both (a) increasing light intensity passing through the front glass substrate 1 and front electrode 3 due to the textured surface(s) of both the front electrode 3 and front glass substrate 1, and (b) increasing the light path in the semiconductor photovoltaic conversion layer 5, while at the same time maintaining good electrical properties of the front electrode 3.

The front electrode 3 may be a single-layer of TCO such as tin oxide, zinc oxide or the like, in certain example embodiments of this invention. In other example embodiments, the front electrode 3 may be made up of multiple layers (e.g., see FIGS. 1 and 6); one or more of which may be conductive. In certain example embodiments of this invention (e.g., see FIGS. 1 and 6), the front electrode 3 of a photovoltaic device is comprised of a multilayer coating including at least one transparent conductive oxide (TCO) layer (e.g., of or including a material such as tin oxide, zinc oxide, or the like) (3a, 3c and/or 3e) and at least one conductive substantially metallic IR reflecting layer (e.g., based on silver, gold, or the like) (3b and/or 3d). In certain example instances, the multilayer front electrode coating may include a plurality of TCO layers (3a, 3c and/or 3e) and/or a plurality of conductive substantially metallic IR reflecting layers (3b and/or 3d) arranged in an alternating manner in order to provide for reduced visible light reflections, increased conductivity, increased IR reflection capability, and so forth (e.g., see FIGS. 1 and 6). In certain example embodiments of this invention, the multilayer front electrode 3 coating is designed to realize one or more of the following advantageous features: (a) reduced sheet resistance ($R_s$) and thus increased conductivity and improved overall photovoltaic module output power; (b) increased reflection of infrared (IR) radiation thereby reducing the operating temperature of the photovoltaic module so as to increase module output power; (c) reduced reflection and increased transmission of light in the region(s) where solar QE is significant such as from about 450-700 nm and/or 450-600 nm which leads to increased photovoltaic module output power; (d) reduced total thickness of the front electrode coating which can reduce fabrication costs and/or time; and/or (e) an improved or enlarged process window in forming the TCO layer(s) because of the reduced impact of the TCO's conductivity on the overall electric properties of the module given the presence of the highly conductive substantially metallic layer(s).

FIG. 1 is a cross sectional view of a photovoltaic device according to an example embodiment of this invention. The photovoltaic device includes transparent front glass substrate 1 having a textured surface closest to the semiconductor film, front electrode 3 (which may be multi-layered or single-layered), active semiconductor film 5 of or including one or more semiconductor layers (such as pin, pn, pinpin tandem layer stacks, or the like), optional back electrode/contact 7 which may be of a TCO and/or metal(s), an optional polymer based encapsulant or adhesive 9 of a material such as ethyl vinyl acetate (EVA) or the like, and an optional rear substrate 11 of a material such as glass. The front glass substrate 1 is on the light incident side of the photovoltaic device. Of course, other layer(s) which are not shown may also be provided in the device. Front glass substrate 1 and/or rear substrate 11 may be made of soda-lime-silica based glass in certain example embodiments of this invention; and may have low iron content and/or an antireflection coating thereon to optimize transmission in certain example instances. While substrates 1, 11 may be of glass in certain example embodiments of this invention, other materials such as quartz or the like may instead be used for substrate(s) 1 and/or 11. Glass 1 and/or 11 may or may not be thermally tempered in certain example embodiments of this invention. Additionally, it will be appreciated that the word "on" as used herein covers both a layer being directly on and indirectly on something, with other layers possibly being located therebetween. Optionally, an antireflective film or other film may be provided on the light-incident side of the substrate 1 in certain example instances.

Figure 5:
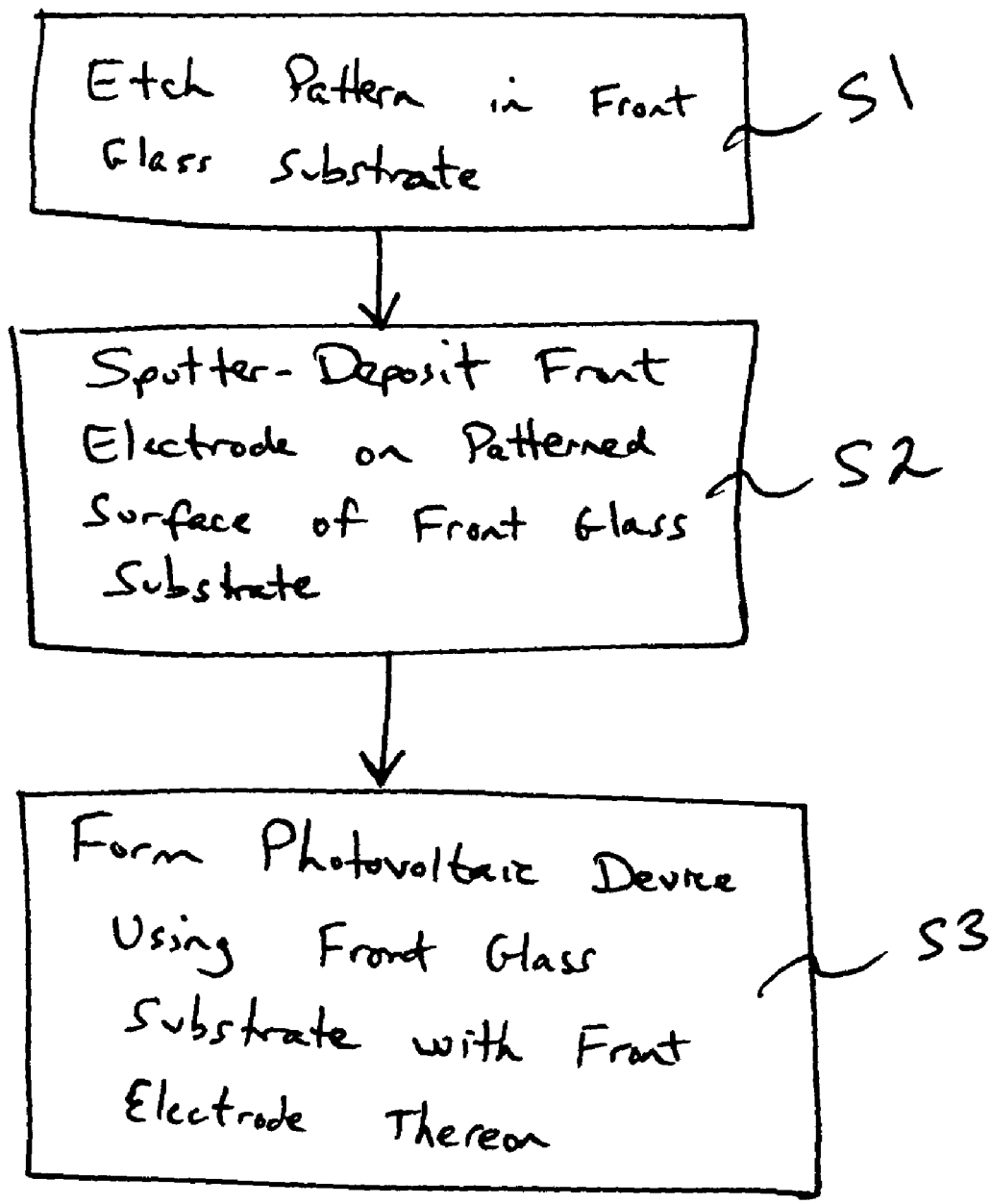
FIG. 5 is a flowchart illustrating example steps in making a photovoltaic device, and front electrode structure therefor, according to an example embodiment of this invention; these steps may be performed in connection with any embodiment of this invention.

Referring to FIGS. 1 and 5, the front electrode structure of the device may be made as follows in certain example embodiments of this invention. Initially, the front glass substrate 1 is provided. Then, one or both major surfaces of the front glass substrate 1 is etched (e.g., via HF etching using HF etchant or the like) or patterned via roller(s) or the like during glass manufacture in order to form a textured (or patterned) surface (see step S1 in FIG. 5). Then, the transparent conductive front electrode 3 is deposited, by sputtering one or more sputtering targets, on the textured surface of the front glass substrate 1 (e.g., see step S2 in FIG. 5). The sputtering may be performed at approximately room temperature, optionally in a vacuum, using rotating magnetron sputtering targets in certain example instances. The use of sputtering to form the conductive electrode 3 is advantageous in that it permits the electrode (single or multi-layered) 3 to be deposited in a conformal manner so that both major surfaces (4a and 4b) of the electrode 3 are shaped in a manner similar to that of the textured surface 1a of the glass substrate 1 on which the electrode 3 has been deposited. Thus, the surface 4a of the front electrode 3 closest to the semiconductor absorber film 5 of the photovoltaic device is also textured. Thereafter, in certain example embodiments, the semiconductor film 5 (and optionally the optional back contact 7) may be formed on the substrate 1 and electrode 3 via any suitable technique (e.g., CVD or the like), and then the rear substrate 11 may be laminated to the front electrode 1 via adhesive film 9 to form the photovoltaic device as shown in FIG. 1 (e.g., see step S3 in FIG. 5). The back contact 7 may or may not be conformal to/with the electrode 3, because the semiconductor 5 may or may not be planarizing in different example embodiments of this invention.

Figure 6:
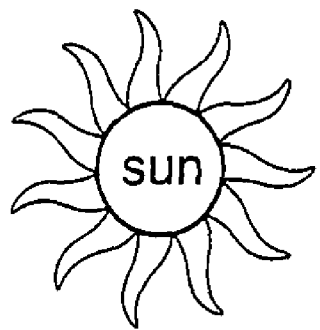
FIG. 6 is a cross sectional view of an example photovoltaic device according to another example embodiment of this invention (note: the textured surfaces of the front glass substrate and front electrode are not shown in this figure for purposes of simplicity).
Figure 6:
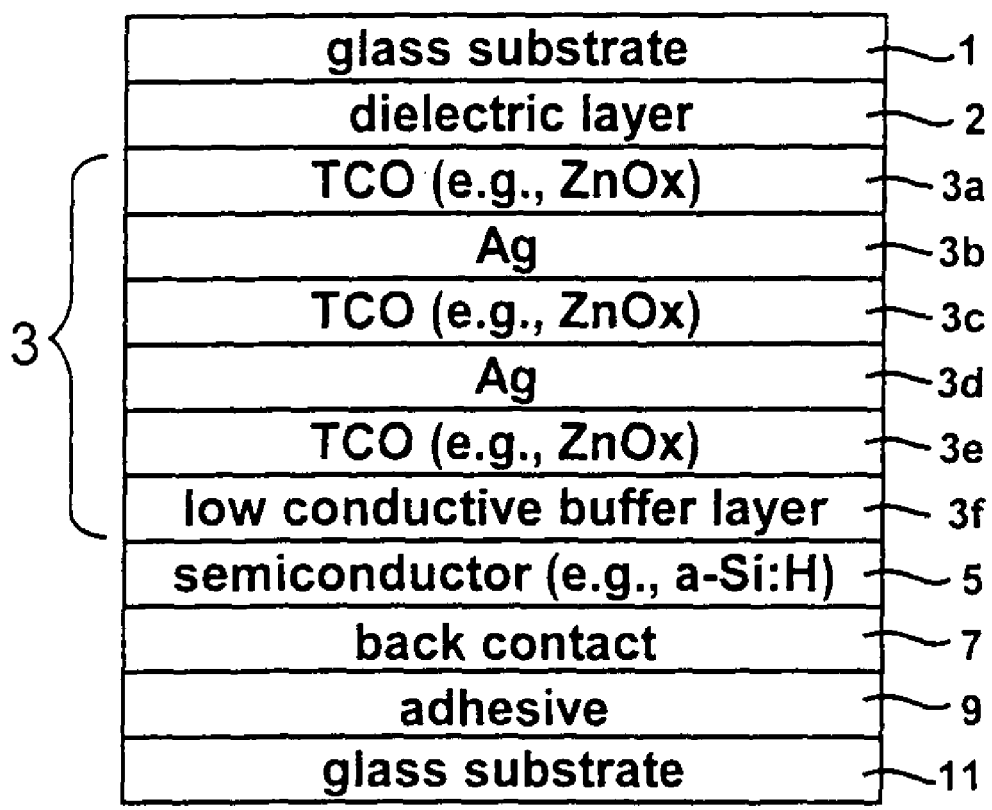

FIG. 6 is a cross sectional view of a photovoltaic device according to another example embodiment of this invention. The FIG. 6 embodiment is the same as the FIG. 1 (and FIG. 5) embodiment except that (i) the front electrode 3 includes certain additional layers 3d-3f in the FIG. 6 embodiment, and (ii) dielectric layer 2 is present in the FIG. 6 embodiment.

Referring to FIGS. 1 and 6 (both multi-layered front electrode embodiments), multilayer front electrode 3 may include from the front glass substrate 1 moving toward semiconductor film 5, first transparent conductive oxide (TCO) layer 3a, first conductive substantially metallic IR reflecting layer 3b, second TCO layer 3c, optional second conductive substantially metallic IR reflecting layer 3d, optional third TCO layer 3e, and optional buffer layer 3f. Optionally, layer 3a may be a dielectric layer (e.g., silicon oxide, silicon nitride, silicon oxynitride, etc.) instead of a TCO in certain example instances and serve as a seed layer for the layer 3b. This multilayer film makes up the front electrode 3 in certain example embodiments of this invention. Note that layers 2 and 3d-3f are not present in the FIG. 1 embodiment, but are present in the FIG. 6 embodiment. Of course, it is possible for certain layers of electrode 3 to be removed in certain alternative embodiments of this invention (e.g., one or more of layers 3a, 3c, 3d and/or 3e may be removed), and it is also possible for additional layers to be provided in the multilayer electrode 3. Front electrode 3 may be continuous across all or a substantial portion of glass substrate 1, or alternatively may be patterned into a desired design (e.g., stripes), in different example embodiments of this invention. Each of layers/films 1-3 is substantially transparent in certain example embodiments of this invention.

First and/or second conductive substantially metallic IR reflecting layers 3b and 3d may be of or based on any suitable IR reflecting material such as silver, gold, or the like. These materials reflect significant amounts of IR radiation, thereby reducing the amount of IR which reaches the semiconductor film 5. Since IR increases the temperature of the device, the reduction of the amount of IR radiation reaching the semiconductor film 5 is advantageous in that it reduces the operating temperature of the photovoltaic module so as to increase module output power. Moreover, the highly conductive nature of these substantially metallic layers 3b and/or 3d permits the conductivity of the overall electrode 3 to be increased. In certain example embodiments of this invention, the multilayer electrode 3 has a sheet resistance of less than or equal to about 15 ohms/square, more preferably less than or equal to about 12 or 9 ohms/square, and even more preferably less than or equal to about 6 ohms/square. Again, the increased conductivity (same as reduced sheet resistance) increases the overall photovoltaic module output power, by reducing resistive losses in the lateral direction in which current flows to be collected at the edge of cell segments. It is noted that first and second conductive substantially metallic IR reflecting layers 3b and 3d (as well as the other layers of the electrode 3) are thin enough so as to be substantially transparent to visible light. In certain example embodiments of this invention, first and/or second conductive substantially metallic IR reflecting layers 3b and/or 3d are each from about 3 to 12 nm thick, more preferably from about 5 to 10 nm thick, and most preferably from about 5 to 8 nm thick. In embodiments where one of the layers 3b or 3d is not used, then the remaining conductive substantially metallic IR reflecting layer may be from about 3 to 18 nm thick, more preferably from about 5 to 12 nm thick, and most preferably from about 6 to 11 nm thick in certain example embodiments of this invention. These thicknesses are desirable in that they permit the layers 3b and/or 3d to reflect significant amounts of IR radiation, while at the same time being substantially transparent to visible radiation which is permitted to reach the semiconductor 5 to be transformed by the photovoltaic device into electrical energy. The highly conductive IR reflecting layers 3b and 3d attribute to the overall conductivity of the electrode 3 much more than the TCO layers; this allows for expansion of the process window(s) of the TCO layer(s) which has a limited window area to achieve both high conductivity and transparency.

First, second, and/or third TCO layers 3a, 3c and 3e, respectively, may be of any suitable TCO material including but not limited to conducive forms of zinc oxide (which may or may not be doped with Al or the like), tin oxide (which may or may not be doped with Sb or the like), indium-tin-oxide, indium zinc oxide (which may or may not be doped with silver), or the like. These layers are typically substoichiometric so as to render them conductive as is known in the art. For example, these layers are made of material(s) which gives them a sheet resistance of no more than about 100 ohms/square, more preferably no more than about 30 ohms/square (more preferably no more than about 25, and most preferably no more than about 20 ohms/square) when at a non-limiting reference thickness of about 400 nm. In certain example embodiments, the electrode 3 or TCO layer(s) may have a resistivity of 1000 ohm-cm or less, more preferably about 750 or 500 ohm-cm or less (the resistivity may be higher than usual given that Ag may be used for lateral conduction in the plane of the film). One or more of these layers may be doped with other materials such as nitrogen, fluorine, aluminum or the like in certain example instances, so long as they remain conductive and substantially transparent to visible light. In certain example embodiments of this invention, TCO layers 3c and/or 3e are thicker than layer 3a (e.g., at least about 5 nm, more preferably at least about 10, and most preferably at least about 20 or 30 nm thicker). In certain example embodiments of this invention, TCO layer 3a is from about 3 to 80 nm thick, more preferably from about 5-30 nm thick, with an example thickness being about 10 nm. Optional layer 3a is provided mainly as a seeding layer for layer 3b and/or for antireflection purposes, and its conductivity is not as important as that of layers 3b-3e. In certain example embodiments of this invention, TCO layer 3c is from about 20 to 150 nm thick, more preferably from about 40 to 120 nm thick, with an example thickness being about 74-75 nm. In certain example embodiments of this invention, TCO layer 3e is from about 20 to 180 nm thick, more preferably from about 40 to 130 nm thick, with an example thickness being about 94 or 115 nm. In certain example embodiments, part of layer 3e, e.g., from about 1-25 nm or 5-25 nm thick portion, at the interface between layers 3e and 5 may be replaced with a low conductivity high refractive index (n) film 3f such as titanium oxide to enhance transmission of light as well as to reduce back diffusion of generated electrical carriers; in this way performance may be further improved.

The alternating nature of the TCO layers 3a, 3c and/or 3e, and the conductive substantially metallic IR reflecting layers 3b and/or 3d (or alternatively of only 3a, 3b and 3c as in FIG. 1, or alternatively of only 3b and 3c as another example), is also advantageous in that it also one, two, three, four or all of the following advantages to be realized: (a) reduced sheet resistance ($R_s$) of the overall electrode 3 and thus increased conductivity and improved overall photovoltaic module output power; (b) increased reflection of infrared (IR) radiation by the electrode 3 thereby reducing the operating temperature of the semiconductor 5 portion of the photovoltaic module so as to increase module output power; (c) reduced reflection and increased transmission of light in the visible region of from about 450-700 nm (and/or 450-600 nm) by the front electrode 3 which leads to increased photovoltaic module output power; (d) reduced total thickness of the front electrode coating 3 which can reduce fabrication costs and/or time; and/or (e) an improved or enlarged process window in forming the TCO layer(s) because of the reduced impact of the TCO's conductivity on the overall electric properties of the module given the presence of the highly conductive substantially metallic layer(s).

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. The p-type a-Si layer of the semiconductor film 5 may be the uppermost portion of the semiconductor film 5 in certain example embodiments of this invention; and the i-layer is typically located between the p and n-type layers. These amorphous silicon based layers of film 5 may be of hydrogenated amorphous silicon in certain instances, but may also be of or include hydrogenated amorphous silicon carbon or hydrogenated amorphous silicon germanium, hydrogenated microcrystalline silicon, or other suitable material(s) in certain example embodiments of this invention. It is possible for the active region 5 to be of a double-junction or triple-junction type in alternative embodiments of this invention. CdTe and/or CdS may also be used for semiconductor film 5 in alternative embodiments of this invention.

Optional back contact or electrode 7 may be of any suitable electrically conductive material. For example and without limitation, the back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). The TCO of the back contact 7 may be of the single layer type or a multi-layer type in different instances. Moreover, the back contact 7 may include both a TCO portion and a metal portion in certain instances. For example, in an example multi-layer embodiment, the TCO portion of the back contact 7 may include a layer of a material such as indium zinc oxide (which may or may not be doped with aluminum or the like), indium-tin-oxide (ITO), tin oxide, and/or zinc oxide closest to the active region 5, and the back contact may include another conductive and possibly reflective layer of a material such as silver, molybdenum, platinum, steel, iron, niobium, titanium, chromium, bismuth, antimony, or aluminum further from the active region 5 and closer to the superstrate 11. The metal portion may be closer to superstrate 11 compared to the TCO portion of the back contact 7.

The photovoltaic module may be encapsulated or partially covered with an encapsulating material such as encapsulant 9 in certain example embodiments. An example encapsulant or adhesive for layer 9 is EVA or PVB. However, other materials such as Tedlar type plastic, Nuvasil type plastic, Tefzel type plastic or the like may instead be used for layer 9 in different instances.

EXAMPLES

Figure 2:
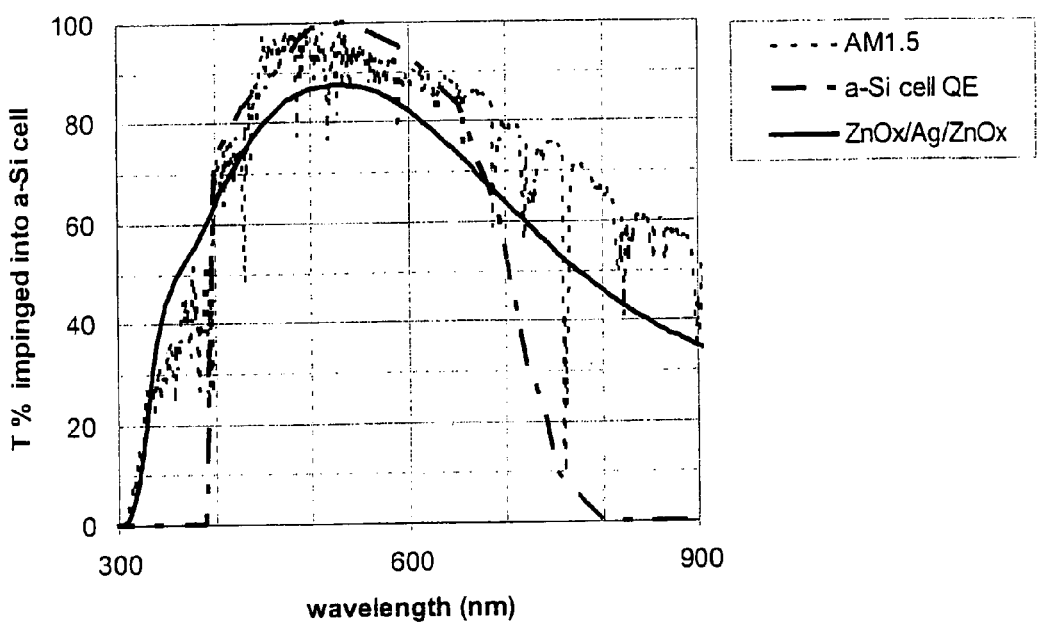
FIG. 2 is a visible transmission (%) into semiconductor film versus wavelength (nm) graph, illustrating characteristics of an example a-Si photovoltaic device regarding quantum efficiency (QE), a multi-layered front electrode structure, and air mass 1.5 (AM1.5), according to an example embodiment (Example 1) of this invention.
Figure 3:
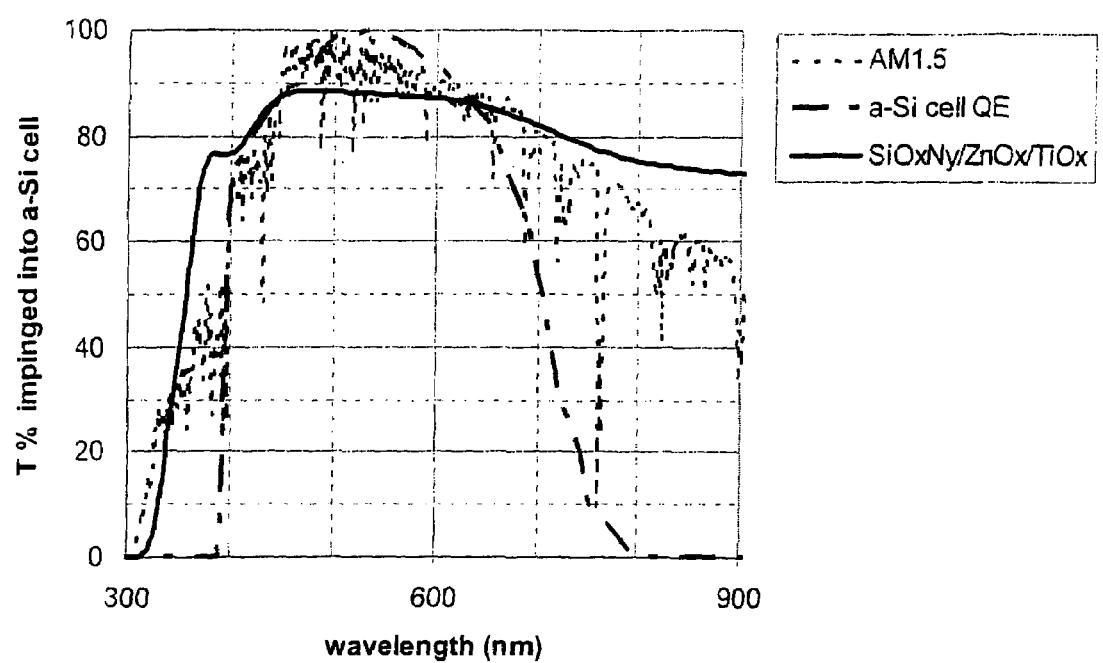
FIG. 3 is a visible transmission (%) into semiconductor film versus wavelength (nm) graph, illustrating characteristics of an example a-Si photovoltaic device regarding quantum efficiency (QE), a multi-layered front electrode structure, and air mass 1.5 (AM1.5), according to another example embodiment (Example 2) of this invention.
Figure 4:
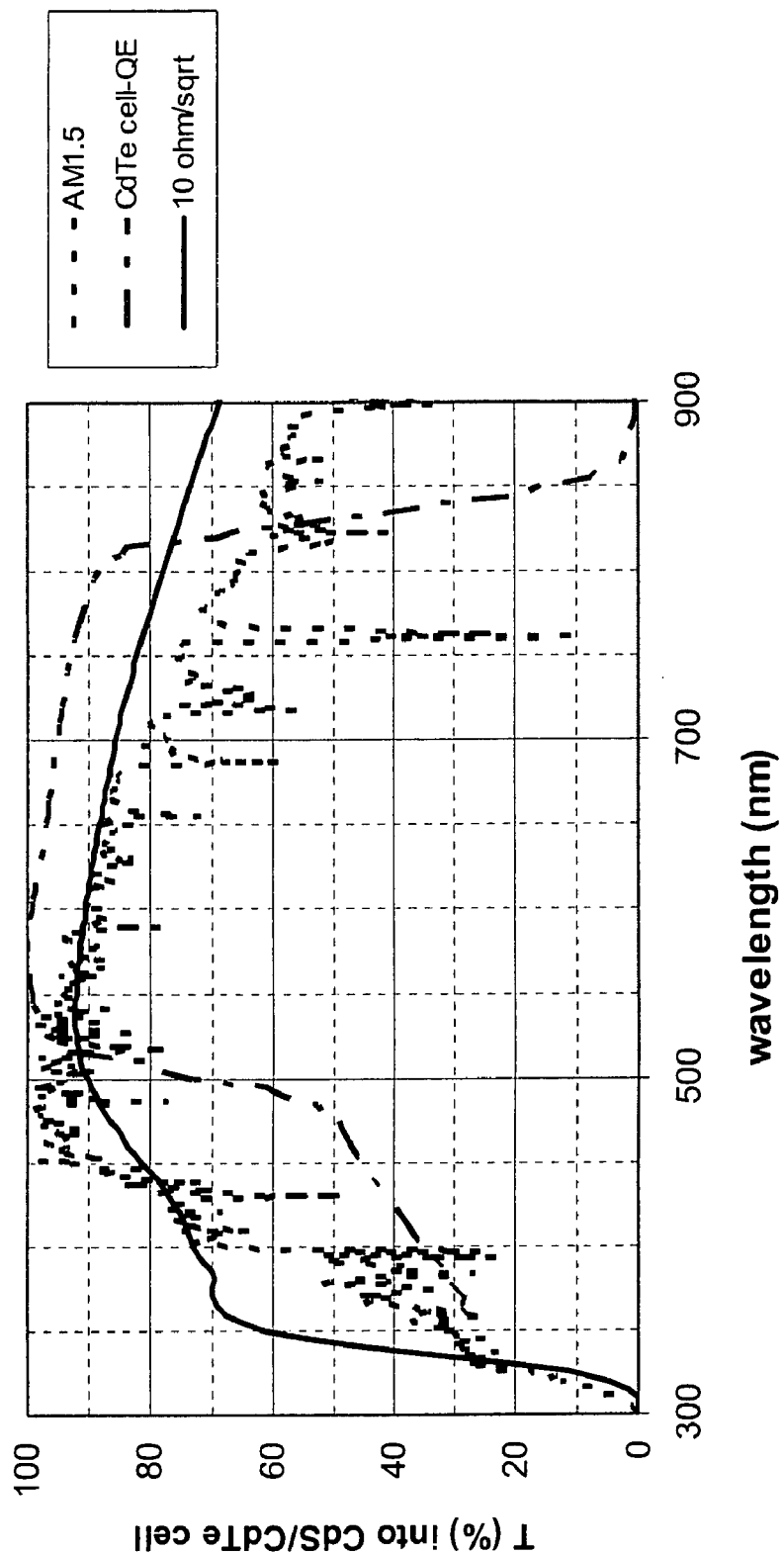
FIG. 4 is a visible transmission (%) into semiconductor film versus wavelength (nm) graph, illustrating characteristics of an example CdTe photovoltaic device regarding quantum efficiency (QE), a multi-layered front electrode structure, and air mass 1.5 (AM1.5), according to yet another example embodiment of this invention.

With reference to FIGS. 2-4 below, it will be explained how in certain example embodiments of this invention a single or multi-layered front electrode 3 can be designed in such a way that the maximum transmission is tailored to the quantum efficiency (QE) of the intended photovoltaic device and the light source spectrum. Then, this front electrode can be fabricated using a magnetron sputtering technique on pre-etched or pre-patterned glass 1. Due to the conformal characteristics of magnetron sputtering, multiple or single layered optical coatings for electrode 3 can be fabricated while preserving or substantially preserving the textured shape 1*a* of the substrate 1 in the major surface 4*a* of the electrode closest to the semiconductor film 5. In this way, the device output can be optimized through both improved light transmission and increased light path. The examples below each had more than 80% transmission (or at least 85%) into the semiconductor film 5 in part or all of the wavelength range of from about 450-600 nm and/or 450-700 nm, where AM1.5 has the strongest intensity (see FIGS. 2-4).

In Example 1 (see FIG. 2), the predicted transmission spectrum impinging into the amorphous silicon semiconductor film 5 from a three layered front electrode 3 was determined. The three layered front electrode 3 in this example included, on the textured surface 1*a* (measured haze of 8.5%) of glass substrate 1 moving from the 3 mm glass 1 toward the semiconductor 5, a 47 nm thick TCO layer 3*a* of zinc oxide doped with aluminum, a 8 nm thick layer 3*b* of silver, and a 106 nm thick TCO layer 3*c* of zinc oxide doped with aluminum. The textured surface 1*a* of the glass substrate 1, and both major surfaces 4*a*, 4*b* of the electrode 3, had peaks and valleys defined therein with inclined portions interconnecting the peaks and valleys. This three layered electrode 3 was sputter deposited on the pre-etched textured surface 1*a* of a soda-lime-silica based glass substrate 1. The measured haze was 8.1% and the measured sheet resistance ($R_s$) of the electrode was 8.9 ohms/square, which are suitable for amorphous and microcrystal silicon single or tandem cell applications. The visible transmission in the graph in FIG. 2 is indicative of the percent of light from the source which made its way through the glass substrate 1 and electrode 3 and impinged upon the a-Si semiconductor film 5. FIG. 2 illustrates that the coating was designed so that its transmission was tailored to the quantum efficiency (QE) and light source spectrum (AM1.5). In particular, FIG. 2 shows that the front electrode structure, including electrode 3 and its textured surface 4*a* and layered make-up and the textured nature of substrate 1, was designed so that (a) its maximum transmission area occurs in the area under a peak area of the quantum efficiency (QE) curve of the photovoltaic device, (b) its maximum transmission occurs in the area under a peak area of the light source spectrum (e.g., AM1.5) (note that AM1.5 refers to air mass 1.5 which represents the AM1.5 photon flux spectrum that may be used to calculate device output power), and (c) its transmission into the semiconductor absorption film (a-Si, uc-Si, or the like) 5 is at least 80% (more preferably at least 85%, or even at least 87% or 88%) in part of, all of, or a substantial part of the wavelength range of from about 450-600 nm and/or 450-700 nm. These characteristics are advantageous for purposes of improving the efficiency of the photovoltaic device as explained herein.

In Example 2 (see FIG. 3), the predicted transmission spectrum impinging into the amorphous silicon (a-Si) semiconductor film 5 from a different type of front electrode 3 was determined. In Example 2 there was formed on the textured surface 1*a* of 3 mm glass substrate 1 moving from the glass 1 toward the semiconductor 5, a 77 nm thick dielectric layer 3*a* of silicon oxynitride, a 350 nm thick TCO layer 3*c* of zinc oxide doped with aluminum, and a 46 nm thick buffer layer 3*e* of titanium oxide (which may or may not be doped with niobium or the like). This three layered electrode 3 was sputter deposited on the pre-etched textured surface 1*a* of a soda-lime-silica based glass substrate 1. The predicted haze was about 9% and the sheet resistance ($R_s$) of the electrode was about 15 ohms/square, which are suitable for amorphous and microcrystal silicon single or tandem cell applications. The visible transmission in the graph in FIG. 3 is indicative of the percent of light from the source which made its way through the glass substrate 1 and electrode 3 and impinged upon the a-Si semiconductor film 5. FIG. 3 illustrates that the coating was designed so that its transmission was tailored to the quantum efficiency (QE) and light source spectrum (AM1.5). In particular, FIG. 3 shows that the front electrode structure, including electrode 3 and its textured surface 4*a* and layered make-up and the textured nature of substrate 1, was designed so that (a) its maximum transmission area occurs in the area under a peak area of the quantum efficiency (QE) curve of the photovoltaic device, (b) its maximum transmission area occurs in the area under a peak area of the light source spectrum (e.g., AM1.5), and (c) its transmission into the semiconductor absorption film 5 is at least 80% (more preferably at least 85%, or even at least 87% or 88%) in part of, all of, or a substantial part of the wavelength range of from about 450-600 nm and/or 450 or 500-700 nm. These characteristics are advantageous for purposes of improving the efficiency of the photovoltaic device as explained herein.

In Example 3 (see FIG. 4), the predicted transmission spectrum impinging into the CdS/CdTe inclusive semiconductor film 5 from a different type of front electrode 3 was determined. In Example 3 there was formed on the textured surface 1*a* of 3 mm glass substrate 1 moving from the glass 1 toward the semiconductor 5, a triple layered dielectric layer 2 of 15 nm thick silicon nitride followed by a 16 nm thick layer of titanium dioxide and then a 10 nm thick layer of zinc oxide doped with aluminum, a 9 nm thick layer 3*b* of silver, and a 140 nm thick low conductive buffer layer 3*f* of tin oxide. This multi-layered electrode 3 was sputter deposited on the pre-etched textured surface 1*a* of a soda-lime-silica based glass substrate 1. The haze was about 2.7% and the sheet resistance ($R_s$) of the electrode was about 10 ohms/square, which are suitable for CdTe thin film solar cell applications. In FIG. 4, the solid line is predicted transmission spectra into the CdS/CdTe photovoltaic device. The transmission in the graph in FIG. 4 is indicative of the percent of light from the source which made its way through the glass substrate 1 and electrode 3 and impinged upon the CdS/CdTe semiconductor film 5. FIG. 4 illustrates that the coating 3 was designed so that its transmission was tailored to the quantum efficiency (QE) and light source spectrum (AM1.5). In particular, FIG. 4 shows that the front electrode structure, including electrode 3 and its textured surface 4a and layered make-up and the textured nature of substrate 1, was designed so that (a) its maximum transmission area occurs in the area under a peak area of the quantum efficiency (QE) curve of the photovoltaic device, (b) its maximum transmission area occurs in the area under a peak area of the light source spectrum (e.g., AM1.5), and (c) its transmission is at least 80% (more preferably at least 85%, or even at least 87% or 88%) in part of, all of, or a substantial part of the wavelength range of from about 450-600 nm and/or 450-750 nm. Note that the QE curve for the CdTe photovoltaic device is shifted relative to those of the a-Si photovoltaic devices in FIGS. 2-3, and the characteristics of the electrode structure were modified accordingly to fit the shifted QE curve. These characteristics are advantageous for purposes of improving the efficiency of the photovoltaic device as explained herein.

In certain example embodiments of this invention, it is possible for the glass substrate 1 to have both a patterned side (e.g., patterned via rollers or the like, to form a prismatic side for instance) and a matte finish side. The matter finish side may be formed via acid etching techniques so that the matte finish side of the glass substrate is an acid etched side of the glass. The electrode 3 may be formed on the matte or acid-etched side of the glass substrate 1 which textured to some extent. Moreover, in certain example embodiments of this invention, the glass substrate 1 has a haze value of from about 10-20%, more preferably from about 12-18%.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making an electrode structure for a photovoltaic device, the method comprising:
   providing a glass substrate;
   etching and/or patterning at least one major surface of the glass substrate so as to form a textured surface of the glass substrate;
   sputter-depositing a substantially conformal front electrode on the textured surface of the glass substrate, the front electrode being substantially conformal so that both major surfaces of the front electrode are textured in a manner similar to the textured surface of the glass substrate, and wherein the substantially conformal front electrode formed on the textured surface of the glass substrate is adapted to be provided at a light incident side of a photovoltaic device; and
   determining a quantum efficiency (QE) curve for a photovoltaic device, and forming the front electrode in a manner so that a maximum transmission area of the front electrode is located under a peak area of a combination of the QE curve and a light source spectrum to be used to power the photovoltaic device.

2. The method of claim 1, wherein the light source spectrum is AM1.5.

3. The method of claim 1, further comprising forming the front electrode in a manner so that a transmission of the front electrode and the glass substrate taken together, into a semiconductor film of the photovoltaic device, is at least 80% in at least a substantial part of a wavelength range of from about 450-600 nm.

4. The method of claim 3, further comprising forming the front electrode in a manner so that the transmission of the front electrode and the glass substrate taken together is at least 85% in at least a substantial part of a wavelength range of from about 450-600 nm.

5. The method of claim 3, further comprising forming the front electrode in a manner so that the transmission of the front electrode and the glass substrate taken together is at least 87% in at least a substantial part of a wavelength range of from about 450-600 nm.

6. The method of claim 3, further comprising forming the front electrode in a manner so that the transmission of the front electrode and the glass substrate taken together is at least 88% in at least a substantial part of a wavelength range of from about 450-600 nm.

7. The method of claim 1, wherein the front electrode is multi-layered and comprises at least one layer that is conductive and substantially transparent.

8. The method of claim 7, wherein the transparent front electrode comprises, moving away from the glass substrate toward a semiconductor film of the photovoltaic device, at least a first substantially transparent conductive substantially metallic infrared (IR) reflecting layer comprising silver and/or gold, and a first transparent conductive oxide (TCO) film located between at least the IR reflecting layer and the semiconductor film.

9. The method of claim 8, wherein the first TCO film comprises one or more of zinc oxide, zinc aluminum oxide, tin oxide, indium-tin-oxide, and indium zinc oxide.

10. The method claim 8, wherein the substantially transparent front electrode further comprises a second substantially transparent conductive substantially metallic infrared (IR) reflecting layer comprising silver and/or gold, and wherein the first transparent conductive oxide (TCO) film is located between at least said first and second IR reflecting layers.

11. The method of claim 10, wherein the first and second IR reflecting layers each comprise silver.

12. The method of claim 1, wherein the glass substrate and front electrode taken together have an IR reflectance of at least about 45% in at least a substantial part of an IR wavelength range of from about 1400-2300 nm and/or 1000-2500 nm.

13. The method of claim 1, wherein the glass substrate has a haze value of from about 10-20%.

* * * * *